United States Patent
Uziel et al.

(10) Patent No.: US 11,637,030 B2
(45) Date of Patent: Apr. 25, 2023

(54) MULTI-STAGE, MULTI-ZONE SUBSTRATE POSITIONING SYSTEMS

(71) Applicant: KLA Corporation, Milpitas, CA (US)

(72) Inventors: Yoram Uziel, Migdal Ha'emek (IL); Ulrich Pohlmann, Jena (DE); Frank Laske, Weilburg (DE); Nadav Gutman, Zichron Ya'aqov (IL); Ariel Hildesheim, Kiryat Tiveon (IL); Aviv Balan, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 336 days.

(21) Appl. No.: 16/900,039

(22) Filed: Jun. 12, 2020

(65) Prior Publication Data
US 2020/0402827 A1 Dec. 24, 2020

Related U.S. Application Data

(60) Provisional application No. 62/862,895, filed on Jun. 18, 2019.

(51) Int. Cl.
*H01L 21/68* (2006.01)
*H01L 21/687* (2006.01)
*H01L 21/67* (2006.01)

(52) U.S. Cl.
CPC ...... *H01L 21/681* (2013.01); *H01L 21/67017* (2013.01); *H01L 21/68735* (2013.01); *H01L 21/68764* (2013.01); *H01L 21/68785* (2013.01)

(58) Field of Classification Search
CPC ............ H01L 21/681; H01L 21/67017; H01L 21/68735; H01L 21/68764; H01L 21/68785; H01L 21/68
(Continued)

(56) References Cited

U.S. PATENT DOCUMENTS 6,183,564 B1 2/2001 Reynolds et al.
6,254,328 B1 7/2001 Wytman
(Continued)

FOREIGN PATENT DOCUMENTS

| EP | 0398365 A2 | 11/1990 |
| KR | 20080052956 A | 6/2008 |
| WO | 2008121561 A1 | 10/2008 |

OTHER PUBLICATIONS

PCT/US2020/038042, International Search Report, dated Oct. 5, 2020.
(Continued)

*Primary Examiner* — Vu A Vu
(74) *Attorney, Agent, or Firm* — Huse IP Law; Charles C. Huse (57) ABSTRACT

A first x-y translation stage, a second x-y translation stage, and a chuck are disposed in a chamber. The chuck is situated above and coupled to the second x-y translation stage, which is situated above and coupled to the first x-y translation stage. The chuck is configured to support a substrate and to be translated by the first and second x-y stages in x- and y-directions, which are substantially parallel to a surface of the chuck on which the substrate is to be mounted. A first barrier and a second barrier are also disposed in the chamber. The first barrier is coupled to the first x-y translation stage to separate a first zone of the chamber from a second zone of the chamber. The second barrier is coupled to the second x-y translation stage to separate the first zone of the chamber from a third zone of the chamber.

28 Claims, 9 Drawing Sheets

(58) Field of Classification Search
USPC .......................................................... 414/816
See application file for complete search history.

(56) References Cited

U.S. PATENT DOCUMENTS

| | | | |
|---|---|---|---|
| 6,593,152 B2* | 7/2003 | Nakasuji | H01J 37/28 |
| | | | 850/11 |
| 6,710,354 B1 | 3/2004 | Koch et al. | |
| 7,119,566 B2* | 10/2006 | Kim | G01R 31/2887 |
| | | | 324/750.19 |
| 7,247,848 B2 | 7/2007 | Nakasuji et al. | |
| 7,541,719 B2 | 6/2009 | Fujita et al. | |
| 7,642,523 B1 | 1/2010 | Devitt | |
| 7,834,978 B2* | 11/2010 | Hirano | G03F 9/7088 |
| | | | 355/53 |
| 8,672,605 B2 | 3/2014 | Meulen et al. | |
| 9,601,307 B2* | 3/2017 | Kanno | H01J 37/28 |
| 9,997,328 B2 | 6/2018 | Rice et al. | |
| 10,056,274 B2 | 8/2018 | Rice et al. | |
| 10,790,111 B2* | 9/2020 | Kanno | H02N 13/00 |
| 2010/0043214 A1 | 2/2010 | Burke et al. | |
| 2013/0294678 A1 | 11/2013 | Blonigan et al. | |
| 2014/0027968 A1 | 1/2014 | (Krivts) et al. | |
| 2015/0075659 A1 | 3/2015 | Rice et al. | |

OTHER PUBLICATIONS

PCT/US2020/038042, Written Opinion of the International Searching Authority, dated Oct. 5, 2020.

\* cited by examiner

Mount a substrate on a chuck to be translated in a chamber by a first x-y translation stage and a second x-y translation stage. The second x-y translation stage is situated above and coupled to the first x-y translation stage. The chuck is situated above and coupled to the second x-y translation stage. A first barrier is coupled to the first x-y translation stage to separate a first zone of the chamber from a second zone of the chamber, wherein the first zone includes space above and beside the chuck and the second zone includes space beside the first x-y translation stage. A second barrier is coupled to the second x-y translation stage to separate the first zone of the chamber from a third zone of the chamber, wherein the third zone includes space beside the second x-y translation stage. (1202)

> The first barrier includes first bellows coupled between the first x-y translation stage and a wall of the chamber. The second barrier includes second bellows coupled between the second x-y translation stage and the first x-y translation stage. (1204)

> The first barrier includes a first plate extending from the first x-y translation stage and a second plate having a portion that overlaps a portion of the first plate and is separated from the first plate by a first gap. The second barrier includes a third plate extending from the second x-y translation stage and a fourth plate having a portion that overlaps a portion of the third plate and is separated from the third plate by a second gap. (1208)

Pump the first zone to provide UHV. Pump the second and third zones to provide a vacuum level with a higher pressure than the UHV of the first zone. (1208)

Nitrogen-purge the first zone at atmospheric pressure. Maintain the second zone and the third zone at atmospheric pressure. (1210)

With the substrate mounted on the chuck in the chamber, translate the first x-y translation stage to a respective position of a plurality of positions. (1212)

With the first x-y translation stage translated to the respective position, translate the second x-y translation stage to scan a respective portion of the substrate. (1214)

Remaining Positions? (1216) — Yes

No

Unload the substrate from the chamber. (1218)

MULTI-STAGE, MULTI-ZONE SUBSTRATE POSITIONING SYSTEMS

RELATED APPLICATION

This application claims priority to U.S. Provisional Patent Application No. 60/862,895, filed on Jun. 18, 2019, which is incorporated by reference in its entirety for all purposes.

TECHNICAL FIELD

This disclosure relates to systems for positioning a substrate (e.g., a semiconductor wafer or reticle), and more specifically to substrate-positioning systems with multiple translation stages.

BACKGROUND

Translation stages are used in chambers (e.g., vacuum chambers) to translate substrates. For example, an x-y-z translation stage may be used in a vacuum chamber to translate a substrate in three directions (i.e., in the x-, y-, and z-directions). Such a stage may be used in a scanning electron microscope (SEM). Translation stages use lubricant, which outgasses and thus contaminates the chamber and the substrate. Plastic materials (e.g., insulators and motor components) in translation stages also outgas, further contaminating the chamber and the substrate. Translation stages are hard to cool, because the flexible tubing that might be used to provide coolant is another source of outgassing.

Translation stages, especially x-y-z translation stages, tend to be heavy. A typical x-y-z translation stage might weigh approximately 100 kg. This weight causes the stage to move slowly (e.g., taking 200-500 milliseconds to move a few millimeters) and to have a long settling time during which vibrations attenuate.

SUMMARY

Accordingly, there is a need for improved substrate-positioning systems and methods.

In some embodiments, a system includes a first x-y translation stage, a second x-y translation stage, and a chuck, which are disposed in a chamber. The second x-y translation stage is situated above and coupled to the first x-y translation stage. The chuck is situated above and coupled to the second x-y translation stage. The chuck is configured to support a substrate and to be translated by the first and second x-y stages in x- and y-directions, wherein the x- and y-directions are substantially parallel to a surface of the chuck on which the substrate is to be mounted. A first barrier and a second barrier are also disposed in the chamber. The first barrier is coupled to the first x-y translation stage to separate a first zone of the chamber from a second zone of the chamber. The second barrier is coupled to the second x-y translation stage to separate the first zone of the chamber from a third zone of the chamber. The first zone includes space above and beside the chuck. The second zone includes space beside the first x-y translation stage. The third zone includes space beside the second x-y translation stage.

In some embodiments, a method includes mounting a substrate on a chuck to be translated in a chamber by a first x-y translation stage and a second x-y translation stage. The second x-y translation stage is situated above and coupled to the first x-y translation stage. The chuck is situated above and coupled to the second x-y translation stage. A first barrier is coupled to the first x-y translation stage to separate a first zone of the chamber from a second zone of the chamber. A second barrier is coupled to the second x-y translation stage to separate the first zone of the chamber from a third zone of the chamber. The first zone includes space above and beside the chuck. The second zone includes space beside the first x-y translation stage. The third zone includes space beside the second x-y translation stage. With the substrate mounted on the chuck in the chamber, the first x-y translation stage is translated to a first position. With the first x-y translation stage translated to the first position, the second x-y translation stage is translated to scan a first portion of the substrate.

In some embodiments, a method includes coupling a first x-y translation stage to a second x-y translation stage, such that the second x-y translation stage is disposed above the first x-y translation stage. A chuck configured to support a substrate is coupled to the second x-y translation stage, such that the chuck is disposed above the second x-y translation stage. The chuck, first x-y translation stage, and second x-y translation stage are installed in a chamber. A first barrier, coupled to the first x-y translation stage, is installed to separate a first zone of the chamber from a second zone of the chamber. A second barrier, coupled to the second x-y translation stage, is installed to separate the first zone of the chamber from a third zone of the chamber. The first zone includes space above and beside the chuck. The second zone includes space beside the first x-y translation stage. The third zone includes space beside the second x-y translation stage.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
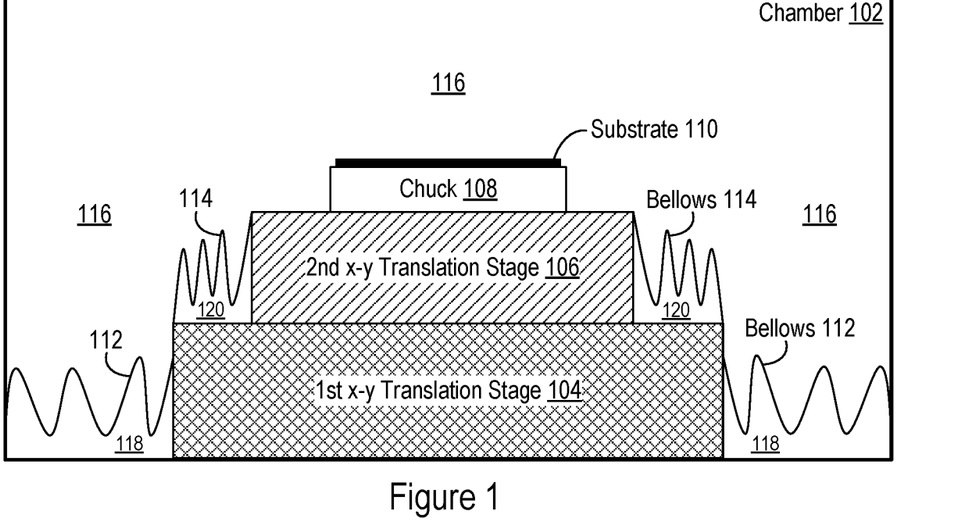
FIG. 1 is a cross-sectional view of a chamber that contains a multi-stage, multi-zone substrate-positioning system with bellows, in accordance with some embodiments.

FIG. 1 is a cross-sectional view of a chamber 102 that contains a multi-stage, multi-zone substrate-positioning system in accordance with some embodiments. The substrate-positioning system includes a first x-y translation stage 104, a second x-y translation stage 106, and a chuck 108. The second x-y translation stage 106 is situated above and coupled to (e.g., directly connected to) the first x-y translation stage 104. The first x-y translation stage 104 is also referred to as the lower stage or lower platform, and the second x-y translation stage 106 is also referred to as the upper stage or upper platform. The chuck 108 is situated above and coupled to (e.g., directly connected to) the second x-y translation stage 106. In the example of FIG. 1, the chuck 108 is thus coupled to the first x-y translation stage 104 through the second x-y translation stage 106. The chuck 108 is configured to support a substrate 110 (e.g., a semiconductor wafer or reticle). In some embodiments, the chamber 102 is part of an inspection system for inspecting substrates 110. A substrate 110 may be mounted on the chuck 108, inspected, and then removed from the chamber 102. The first x-y translation stage 104 and second x-y translation stage 106 translate the chuck 108 and substrate 110 during the inspection process. In some embodiments, the first x-y translation stage 104 and/or second x-y translation stage 106 use air bearings or mechanical bearings or are flexure-based.

The first x-y translation stage 104 and second x-y translation stage 106 move in the x-y plane (i.e., in x- and y-directions). In FIG. 1, the x-direction is horizontal, the y-direction is perpendicular to the page (or vice-versa), and the z-direction is vertical. The x- and y-directions are substantially parallel (e.g., to within manufacturing tolerances) to the surface of the chuck on which the substrate 110 is mounted (or is to be mounted, when the substrate 110 is not present). Movement of the first x-y translation stage 104 translates (i.e., moves) the second x-y translation stage 106 and the chuck 108. Movement of the second x-y translation stage 106 translates the chuck 108 but not the first x-y translation stage 104. The first x-y translation stage 104 may move while the second x-y translation stage 106 is stationary relative to the first x-y translation stage 104. The second x-y translation stage 106 may move while the first x-y translation stage 104 is stationary.

In some embodiments, the travel for scanning the entire substrate 110 (e.g., beneath an inspection-tool head 704, FIGS. 7-8) is split between the first x-y translation stage 104 and the second x-y translation stage 106. The first x-y translation stage 104 is configured to provide a first amount of travel (i.e., has a first maximum amount of travel) that is insufficient to scan the entire substrate 110. The second x-y translation stage 106 is configured to provide a second amount of travel (i.e., has a second maximum amount of travel) that is also insufficient to scan the entire substrate 110. The first and second amounts of travel together, however, are sufficient to scan the entire substrate 110: added together, they equal or exceed the amount of travel needed to scan the entire substrate 110. For example, the first amount of travel and the second amount of travel may each be equal to half of the amount of travel needed to scan the entire substrate 110. In this example, if the substrate 110 is a semiconductor wafer, then the first amount of travel and the second amount of travel are each plus and minus one fourth of the wafer diameter in both the x- and y-directions. If the semiconductor wafer is a 300 mm wafer (i.e., has a 300 mm diameter) in this example, then the first amount of travel is ±75 mm in the x-direction and ±75 mm in the y-direction, and the second amount of travel is ±75 mm in the x-direction and ±75 mm in the y-direction. In other examples, the first amount of travel and the second amount of travel are not each equal to half of the amount of travel needed to scan the entire substrate 110. For example, the first amount of travel may be greater than half (e.g., 70%) of the amount of travel needed to scan the entire substrate 110 and the second amount of travel may be less than half (e.g., 30%) of the amount of travel needed to scan the entire substrate 110.

In some embodiments, the first x-y translation stage 104 is heavier than the second x-y translation stage 106. For example, the first x-y translation stage 104 may be 70-80 kg while the second x-y translation stage 106 may be 2-15 kg (e.g., 10-15 kg, or 2-10 kg, or 2-3 kg). Decreasing the weight of the second x-y translation stage 106 increases speed, reduces stopping time, and reduces settling time during which vibrations attenuate for the second x-y translation stage 106. Weight of the second x-y translation stage 106 may be traded off against the second amount of travel: the weight of the second x-y translation stage 106 may be reduced by reducing the second amount of travel and increasing the first amount of travel accordingly, so that the entire substrate 110 can still be scanned. For example, the second amount of travel may be less than half the amount of travel needed to scan the entire substrate 110, and the first amount of travel may be more than half the amount of travel needed to scan the entire substrate 110.

Dividing the travel for scanning the entire substrate 110 between the first x-y translation stage 104 and the second x-y translation stage 106 allows respective barriers to be used to divide the chamber 102 into distinct zones that are sealed off from each other. In some embodiments, these barriers are bellows. In the chamber 102, first bellows 112 is coupled to (e.g., directly connected to) the first x-y translation stage 104. Second bellows 114 is coupled to (e.g., directly connected to) the second x-y translation stage 106. The first bellows 112 may be coupled between the first x-y translation stage 104 and a wall of the chamber 102 (e.g., an interior surface extending around the inside of the chamber 102). The second bellows 114 may be coupled between the second x-y translation stage 106 (e.g., an outer side surface of the second x-y translation stage 106) and the first x-y translation stage 104 (e.g., a corner or top surface of the first x-y translation stage 104). The first bellows 112 is a first barrier that separates a first zone 116 of the chamber 102 from a second zone 118 of the chamber 102. The second bellows 114 is a second barrier that separates the first zone 116 of the chamber 102 from a third zone 120 of the chamber 102. The first bellows 112 and second bellows 114 may be stainless steel.

The first bellows 112 and second bellows 114 act as respective flexible skirts around the first x-y translation stage 104 and the second x-y translation stage 106 to separate the zones 116, 118, and 120. As FIG. 1 shows, the first zone 116 includes space above and beside the chuck 108, the second zone 118 includes space beside the first x-y translation stage 104, and the third zone 120 includes space beside the second x-y translation stage 106. The flexibility of the bellows 112 and 114, which results from their concertinaed sides, allows portions of the bellows 112 and 114 to compress and expand in the x-y plane to accommodate respective travel of the first x-y translation stage 104 and the second x-y translation stage 106. This travel and accompanying deformation of the bellows 112 and 114 changes the shapes and locations of the zones 116, 118, and 120 accordingly. Using separate bellows 112 and 114 for the first and second x-y translations stages 104 and 106, as opposed to a single bellows extending from a single translation stage, limits the extent of each bellows 112 and 114, preventing them from collapsing and preventing successive sides of the bellows from rubbing against each other. Such rubbing would cause friction and generate particles that would contaminate the chamber 102 and substrate 110. The bellows 112 and 114 are considered two-dimensional (2D) bellows, because they accommodate two-dimensional motion (i.e., in the x-y plane) of the first and second x-y translations stages 104 and 106.

Figure 2:
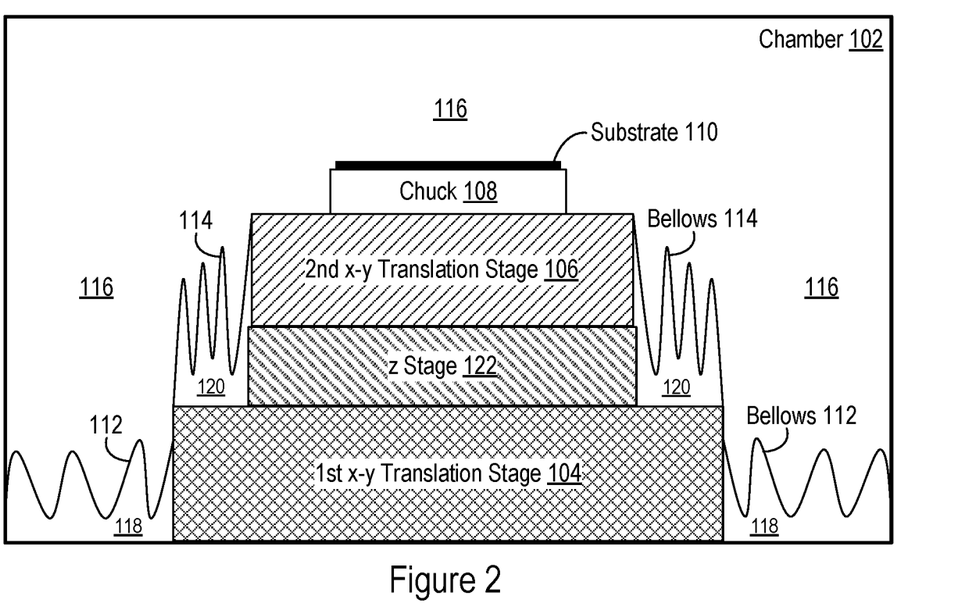
FIG. 2 is a cross-sectional view of a chamber that contains a multi-stage, multi-zone substrate-positioning system with a z stage and bellows, in accordance with some embodiments.

In some embodiments, the substrate-positioning system of the chamber 102 also includes a z stage that moves the chuck 108 and substrate 110 in the z-direction (i.e., vertically up and down). FIG. 2 is a cross-sectional view of the chamber 102 with a substrate-positioning system that includes a z stage 122 in addition to the components of FIG. 1. The z stage 122 may be coupled between the first x-y translation stage 104 and the second x-y translation stage 106. The chuck 108 thus may be coupled to the first x-y translation stage 104 through the second x-y translation stage 106 and the z stage 122. The z-stage 122 moves the second x-y translation stage 106, chuck 108, and substrate 110 (assuming the substrate 110 is mounted on the chuck 108) up and down, but does not move the first x-y translation stage 104. Movement of the first x-y translation stage 104 translates the z stage 122 as well as the second x-y translation stage 106, chuck 108, and substrate 110 (assuming the substrate 110 is mounted on the chuck 108).

Figure 3:
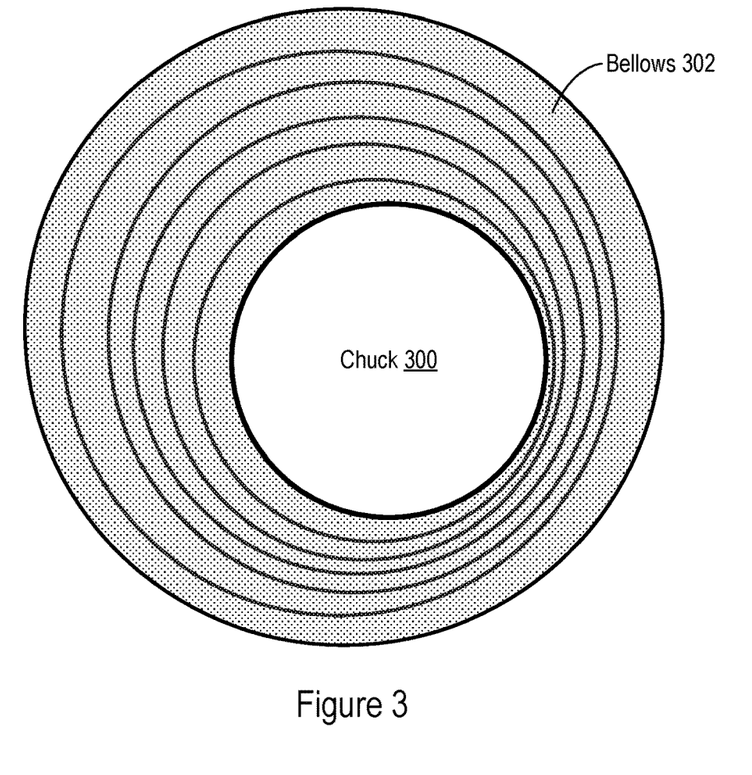
FIG. 3 is a plan view of a chuck surrounded by bellows, in accordance with some embodiments.

FIG. 3 is a plan view of a chuck 300 surrounded by bellows 302, in accordance with some embodiments. The chuck 300, which is an example of the chuck 108 (FIGS. 1-2), is mounted on a second x-y translation stage 106 (FIGS. 1-2), which is not visible in FIG. 3 because it is obscured by the chuck 300. The bellows 302 is an example of bellows 114 (FIGS. 1-2). In some embodiments, the inner circumference of the bellows 302 is connected to the side of the second x-y translation stage 106 and the outer circumference of the bellows 302 is connected to the first x-y translation stage 104 (not shown).

In the example of FIG. 3, the chuck 300 has been translated from a center position to a position that is offset to the lower-right side of FIG. 3. The lower-right portion of the bellows 302 has compressed accordingly, while the upper-left portion of the bellows 302 has expanded accordingly.

The chuck 300 is circular. The bellows 302 are circular, 2D bellows. Alternatively, the chuck 300 and bellows 302 may have different shapes. For example, the chuck 300 may be rectangular (e.g., with a recessed circular surface to receive a semiconductor wafer) and the bellows 302 may be rectangular, 2D bellows. Similarly, the bellows 112 (FIGS. 1-2) may be circular 2D bellows or rectangular 2D bellows.

Figure 4:
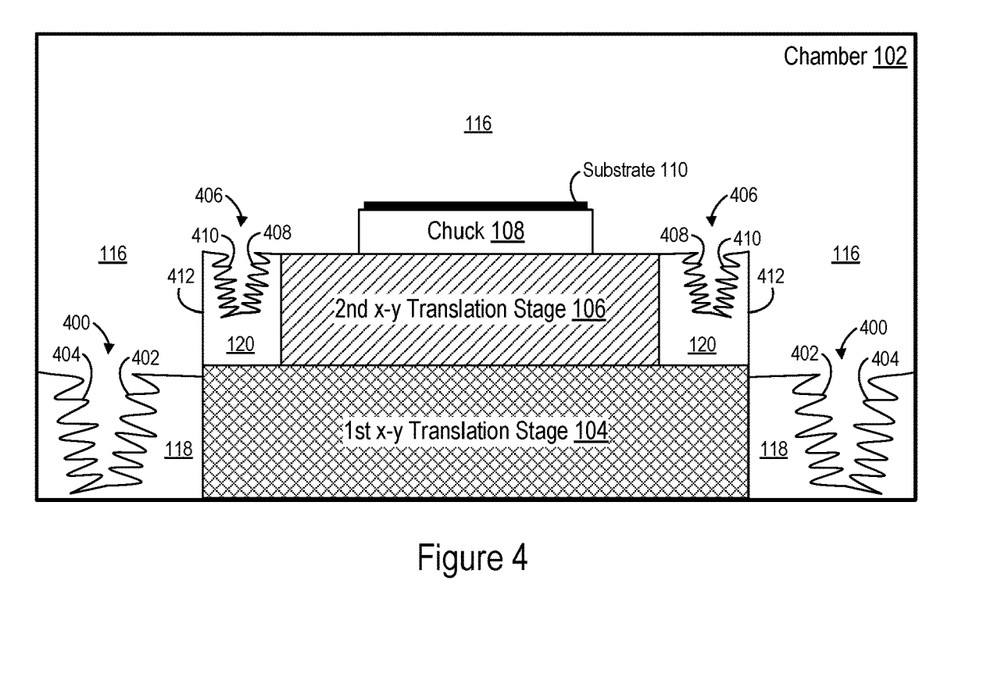
FIG. 4 is a cross-sectional view of a chamber that contains a multi-stage, multi-zone substrate-positioning system with bellows that each include two connected sequences of concertinaed sides, in accordance with some embodiments.

The bellows 112 and 114 each include a single sequence of concertinaed sides, as shown in FIGS. 1-2. Alternatively, each bellows may be implemented using two connected sequences of concertinaed sides. FIG. 4 is a cross-sectional view of the chamber 102 in which the bellows 112 and 114 are replaced with respective bellows 400 and 406, each of which includes two connected sequences of concertinaed sides, in accordance with some embodiments.

The bellows 400, which are coupled to (e.g., directly connected to) the first x-y translation stage 104, includes a first sequence 402 of concertinaed sides connected to a second sequence 404 of concertinaed sides. In some embodiments, the sequences 402 and 404 are arranged in series between the first x-y translation stage 104 and a wall of the chamber 102 (e.g., an interior surface extending around the inside of the chamber 102). When the bellows 400 are not fully extended, the first sequence 402 extends downward from its point of coupling with the first x-y translation stage 104 to the point at which it connects to the second sequence 404. The second sequence 404 extends upward from the point at which it connects to the first sequence 402 to its point of coupling with the wall of the chamber 102.

The bellows 406, which are coupled to (e.g., directly connected to) the second x-y translation stage 106, includes a first sequence 408 of concertinaed sides connected to a second sequence 410 of concertinaed sides. In some embodiments, the sequences 408 and 410 are arranged in series between the second x-y translation stage 106 and a plate 412 that extends vertically from the first x-y translation stage 104 (e.g., from a top surface or corner of the first x-y translation stage 104). When the bellows 406 are not fully extended, the first sequence 408 extends downward from its point of coupling with the second x-y translation stage 106 to the point at which it connects to the second sequence 410. The second sequence 410 extends upward from the point at which it connects to the first sequence 408 to its point of coupling with the plate 412 (e.g., to the far end of the plate 412). The dual-sequence configuration of the bellows 400 and 406 provides low friction and therefore reduces the force used to move the first and second x-y translation stages 104 and 106.

The bellows 400 and 406, like the bellows 112 and 114, are 2D bellows: they accommodate two-dimensional motion (i.e., in the x-y plane) of the first and second x-y translations stages 104 and 106

Bellows are one type of barrier that may be used to separate the zones 116, 118, and 120. For another type of barrier, partially overlapping plates separated by a narrow gap are used.

Figure 5:
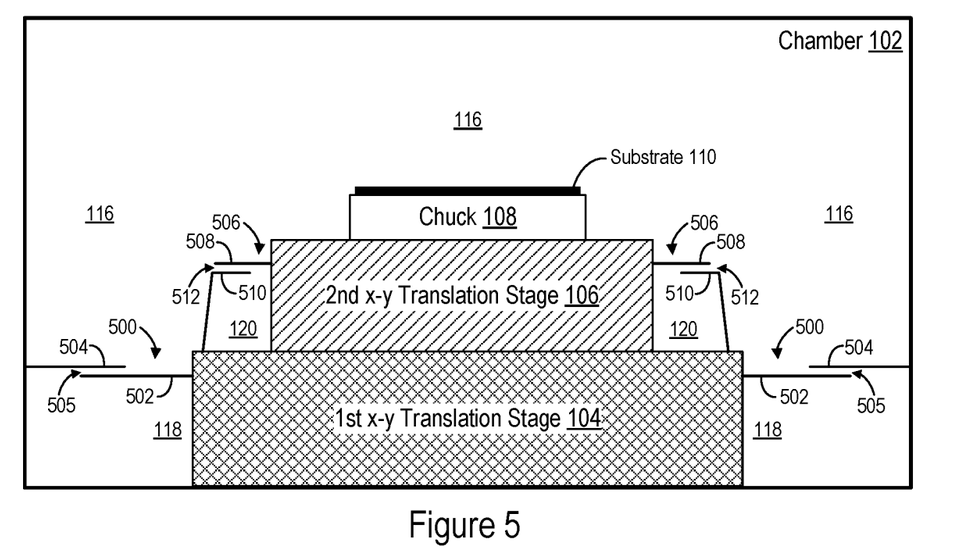
FIG. 5 is a cross-sectional view of a chamber that contains a multi-stage, multi-zone substrate-positioning system with partially overlapping plates, in accordance with some embodiments.
Figure 6:
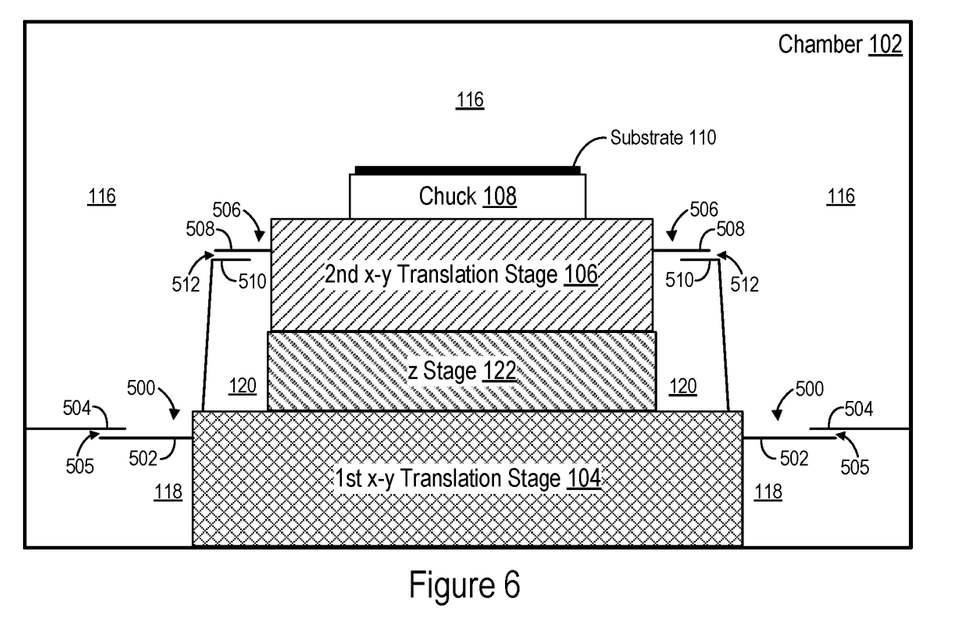
FIG. 6 is a cross-sectional view of a chamber that contains a multi-stage, multi-zone substrate-positioning system with a z stage and partially overlapping plates, in accordance with some embodiments.

FIG. 5 is a cross-sectional view of the chamber 102 in which pairs of partially overlapping plates serve as respective first and second barriers 500 and 506 that separate the zones 116, 118, and 120. The first barrier 500 includes a plate 502 that extends from the first x-y translation stage 104 and a plate 504 that partially overlaps with the plate 502 (i.e., a portion of the plate 504 overlaps a portion of the plate 502) and is separated from the plate 502 by a gap 505. The second barrier 506 includes a plate 508 that extends from the second x-y translation stage 106 and a plate 510 that partially overlaps with the plate 508 (i.e., a portion of the plate 510 overlaps a portion of the plate 508) and is separated from the plate 508 by a gap 512. In some embodiments, the plate 504 is connected to a wall of the chamber 102 (e.g., an interior surface extending around the inside of the chamber 102). In some embodiments, the plate 510 is connected to (e.g., extends from) the first x-y translation stage 104 (e.g., a top surface or corner of the first x-y translation stage 104). The plate 510 may be bent or curved to accommodate this connection. In some embodiments, the gaps 505 and 512 are in the range of 0.5-1.0 mm wide (i.e., the distance between the overlapping portions of respective plates is 0.5-1.0 mm). The plates 502, 504, 508, and 510 may be stainless steel. In some embodiments, a z stage 122 is also present (e.g., coupled between the first x-y translation stage 104 and the second x-y translation stage 106, as shown in FIG. 6 in accordance with some embodiments.)

The use of plates for the first and second barriers 500 and 506 reduces the force used to move the first and second x-y translation stages 104 and 106. However, the resulting gaps 505 and 512 cause the zones 116, 118, and 120 not to be completely sealed from each other.

In some embodiments, a substrate-positioning system may use bellows 112 or 400 as a first barrier and plates 506 as a second barrier. In some embodiments, a substrate-positioning system may use plates 500 as a first barrier and bellows 114 or 406 as a second barrier.

Figure 7:
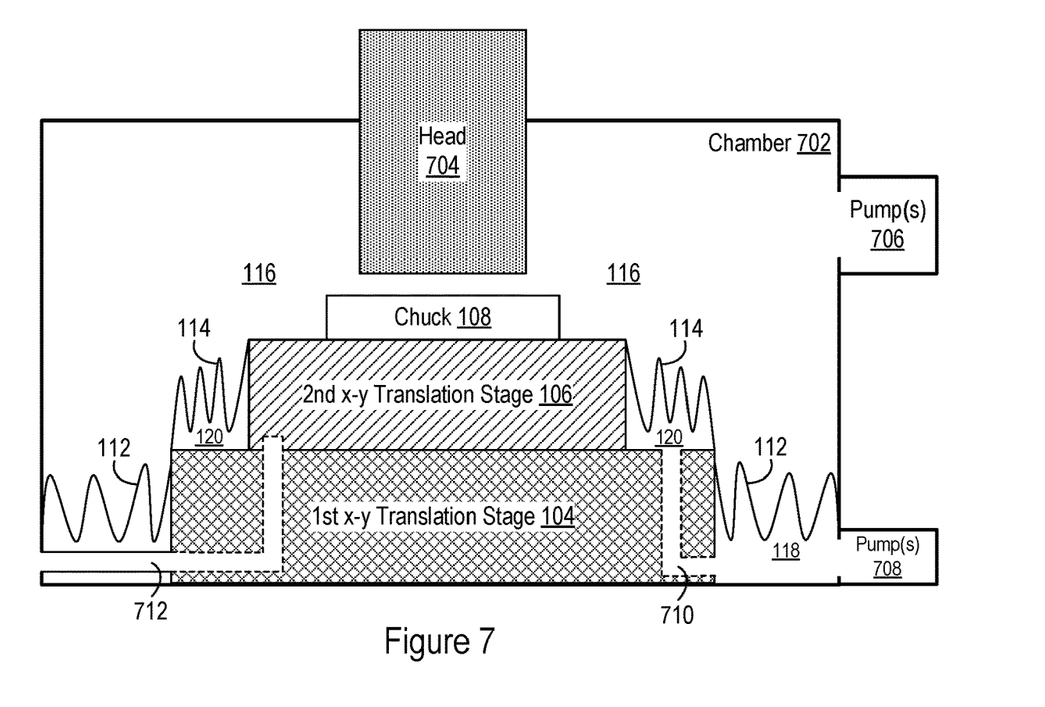
FIG. 7 is a cross-sectional view of a vacuum chamber with an inspection-tool head and a multi-stage, multi-zone substrate-positioning system with bellows, in accordance with some embodiments.
Figure 8:
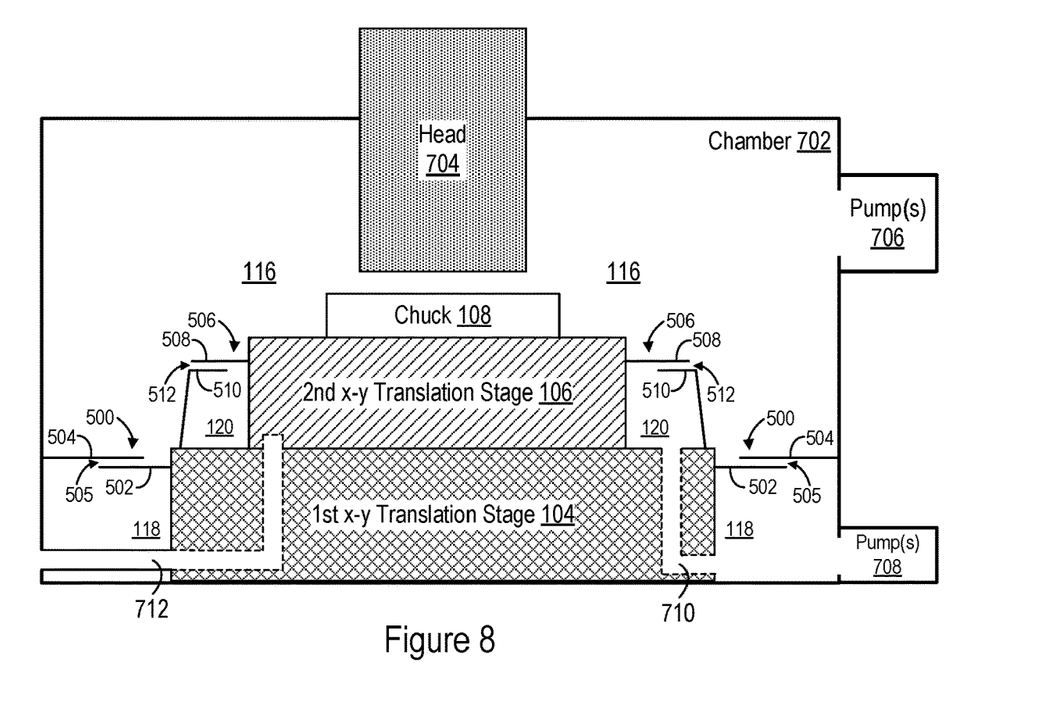
FIG. 8 is a cross-sectional view of a vacuum chamber with an inspection-tool head and a multi-stage, multi-zone substrate-positioning system with plates, in accordance with some embodiments.

In some embodiments, the chamber 102 is a vacuum chamber (e.g., for an electron microscope, such as a SEM). FIGS. 7 and 8 are cross-sectional views of a vacuum chamber 702 in accordance with some embodiments. The vacuum chamber 702, which is an example of the chamber 102, includes the first and second x-y translation stages 104 and 106 and chuck 108, and also includes an inspection-tool head 704 (e.g., an electron-microscope head, such as a SEM head) that extends into the vacuum chamber 702. (A substrate 110 is not shown in FIG. 7 but may be present. The vacuum chamber 702 optionally also includes a z stage, such as the z stage 122, FIGS. 2 and 6.) The chuck 108 is positioned beneath the head 704. A substrate 110 mounted on the chuck 108 may be scanned beneath the head 704 by moving the first and second x-y translation stages 104 and 106, thus allowing inspection of the substrate 110.

In the example of FIG. 7, bellows 112 and 114 separate the first zone 116 from the second and third zones 118 and 120. In the example of FIG. 8, plates 500 and 506 separate the first zone 116 from the second and third zones 118 and 120. One or more vacuum pumps 706 are connected to the first zone 116 to provide a vacuum in the first zone 116. One or more vacuum pumps 708 are connected to the second and third zones 118 and 120 to provide a vacuum in the second and third zones 118 and 120. The second zone 118 may be connected to the third zone 120 through one or more passages 710 (e.g., an opening or tubing) in the first x-y translation stage 104 to allow the pump(s) 708 to pump down the third zone 120 as well as the second zone 118. In some embodiments, the pump(s) 706 provide an ultra-high vacuum (UHV) in the first zone 116, while the pump(s) 708 provide a lower (i.e., higher pressure) vacuum (e.g., a technical vacuum that is lower than, and thus has higher pressure than, UHV) in the second and third zones 118 and 120. UHV is a standard, well-known technical term that refers to vacuums with a pressure on the order of $10^{-9}$ torr or lower. For example, the pump(s) 708 may provide a technical vacuum on the order of $10^{-3}$ torr in the second and third zones 118 and 120. Maintaining respective vacuums on both sides of the bellows 112 and 114 avoids pressure on the bellows 112 and 114 that could damage them or interfere with their operation.

Sealing the first zone 116 from the second and third zones 118 and 120 using either bellows 112 and 114 (FIG. 7) or plates 500 and 506 (FIG. 8), along with solid outer surfaces of the first and second x-y translation stages 104 and 106, prevents contaminants that outgas into the second and third zones 118 and 120 from reaching the first zone 116. For embodiments using plates 500 or 506, a small amount of contamination may pass through the gaps 505 and 512 into the first zone 116, but the level of contamination is dramatically reduced compared to systems without barriers. These contaminants, which may include contaminants that outgas from insulators and plastic motor components in the translation stages and lubricant for the translation stages, thus do not contaminate the substrate 110 or the head 704 (or such contamination is dramatically reduced). Defects in the substrate 110 are reduced accordingly, and reliability of the head 704 is improved (e.g., time between performing plasma cleanings of the chamber 702 is increased). In a prophetic example, a vacuum on the order of $10^{-12}$ torr may be achieved in the first zone 116.

Motion of the first and second x-y translation stages 104 and 106 generates heat. In some embodiments, flexible tubing 712 is disposed in the second zone 118 to provide liquid coolant (e.g., water) to the first x-y translation stage 104 to cool the stage. The tubing 712 may extend to the second x-y translation stage 106 to cool that stage as well. The tubing may be polymer-based (e.g., plastic). Such materials outgas, but barriers (e.g., bellows 112 and 114, FIG. 7, or plates 500 and 506, FIG. 8) prevent this outgassing from degrading the vacuum in the first zone 116 and from contaminating the substrate 110 and head 704.

Figure 9:
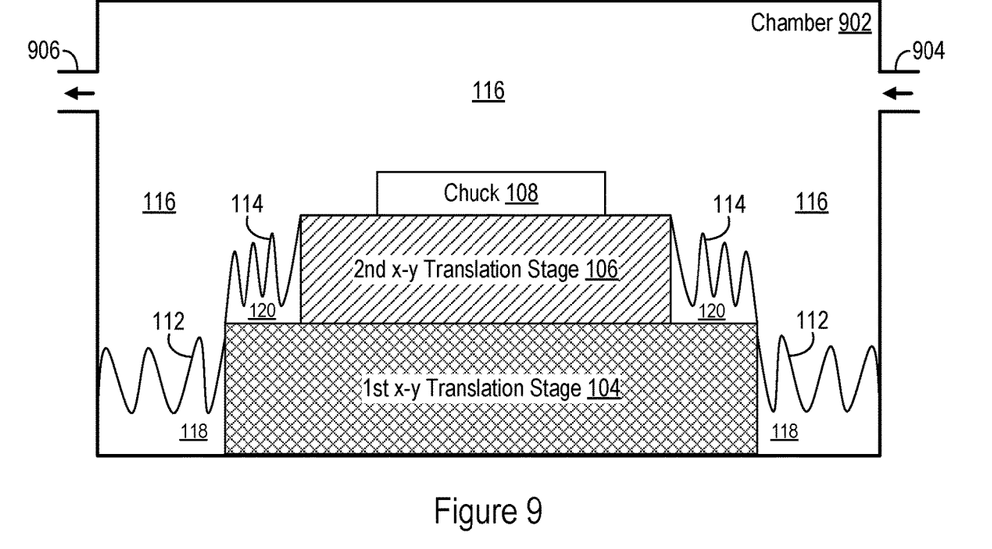
FIG. 9 is a cross-sectional view of a chamber configured to operate at atmospheric pressure and containing a multi-stage, multi-zone substrate-positioning system with bellows, in accordance with some embodiments.
Figure 10:
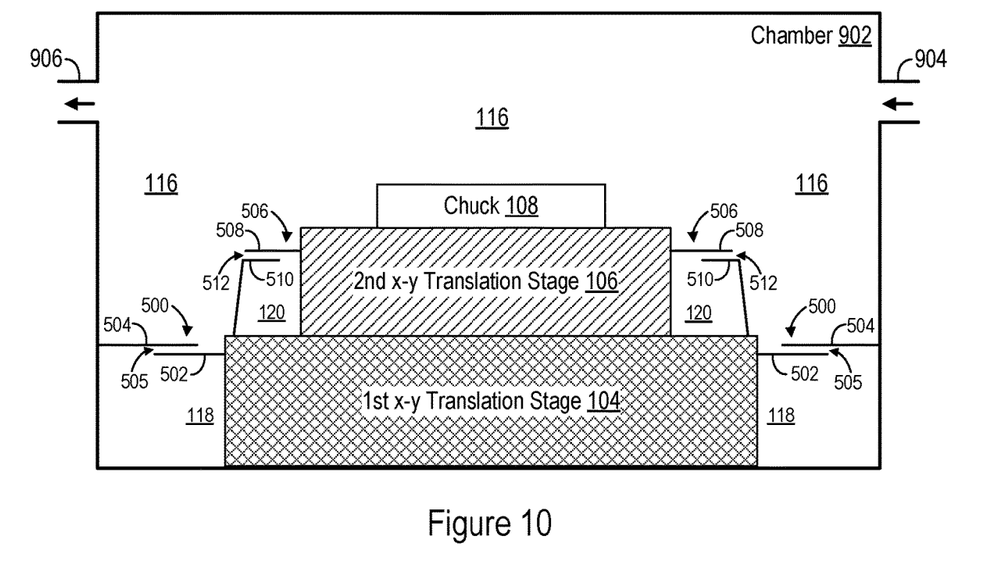
FIG. 10 is a cross-sectional view of a chamber configured to operate at atmospheric pressure and containing a multi-stage, multi-zone substrate-positioning system with plates, in accordance with some embodiments.

In some embodiments, the chamber 102 operates at atmospheric pressure. FIGS. 9 and 10 are cross-sectional views of a chamber 902 configured to operate at atmospheric pressure, in accordance with some embodiments. In some embodiments, the chamber 902 is part of an optical inspection system for optically inspecting substrates 110. The chamber 902, which is an example of the chamber 102, includes the first and second x-y translation stages 104 and 106 and chuck 108. (A substrate 110 is not shown in FIG. 9 but may be present. The chamber 902 optionally also includes a z stage, such as the z stage 122, FIGS. 2 and 6.) In the example of FIG. 9, bellows 112 and 114 separate the first zone 116 from the second and third zones 118 and 120. In the example of FIG. 10, plates 500 and 506 separate the first zone 116 from the second and third zones 118 and 120.

The first zone 116 is connected to a purge inlet line 904 to introduce gas into the first zone 116 during operation and a purge exhaust line 906 to vent the gas from the first zone 116 during operation. The gas may be substantially oxygen-free (e.g., to within purification capability), causing the first zone 116 to be substantially oxygen-free (e.g., at atmospheric pressure) during operation, while oxygen may be present in the second and third zones 118 and 120 during operation (e.g., with the second and third zones 118 and 120 at atmospheric pressure). In some embodiments, the gas is N₂. For example, the first zone 116 may be configured for nitrogen purge at atmospheric pressure during operation, and the second and third zones 118 and 120 may be configured to be at atmospheric pressure during operation.

Figure 11:
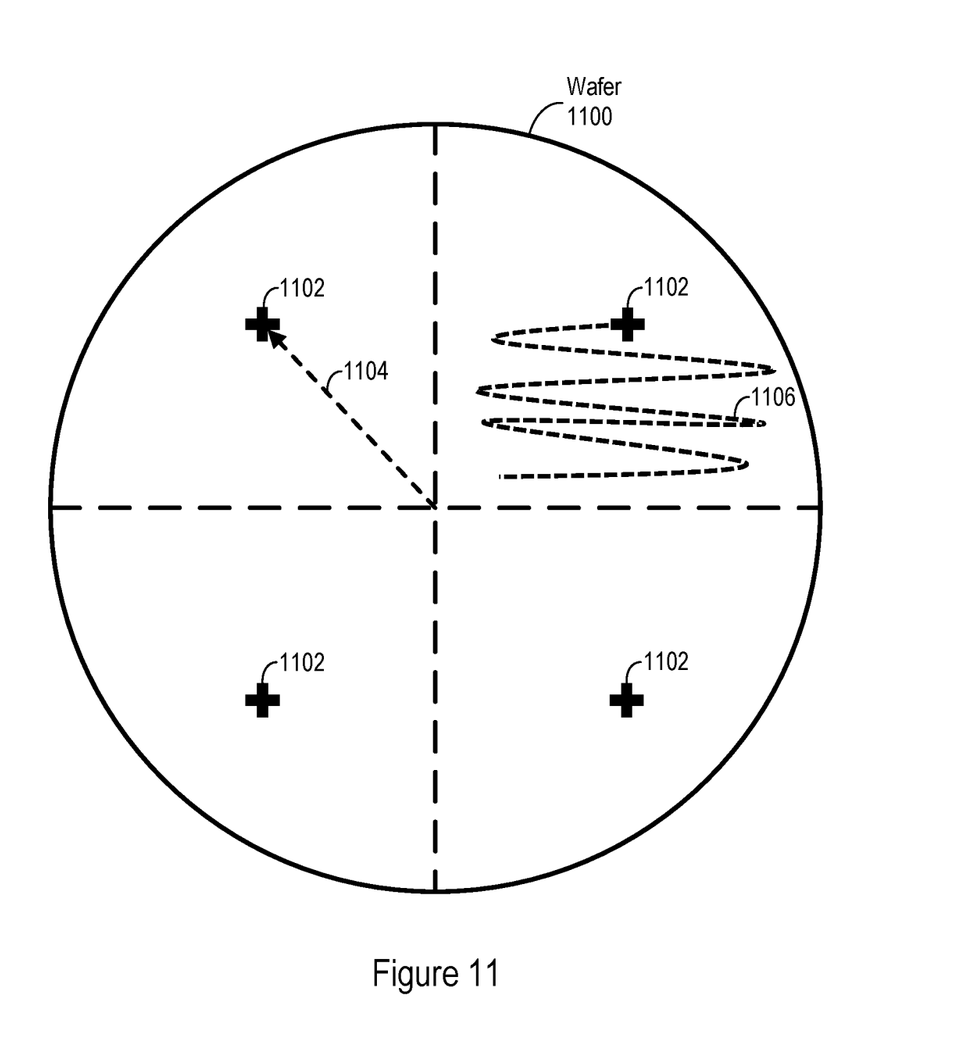
FIG. 11 shows a map of a semiconductor wafer with stations for a linear actuator, in accordance with some embodiments.

In some embodiments (e.g., in accordance with any of FIGS. 1-10), the first x-y translation stage 104 includes (e.g., is implemented as) a linear actuator configured to travel between specified stations. The stations are predefined before a substrate 110 is loaded onto the chuck 108, in accordance with some embodiments. FIG. 11 shows a map of a semiconductor wafer 1100 with four stations 1102 (the center of the wafer may be a fifth station), in accordance with some embodiments. The semiconductor wafer 1100 is an example of a substrate 110. The four stations 1102 are centers of respective quarters 1101 into which the semiconductor wafer 1100 is divided. The first x-y translation stage 104 is configured for travel 1104 from the center of the wafer to the stations 1102 and/or between the stations 1102. For example, the travel 1104 causes the wafer 1100 to move from being centered beneath a head 704 to having a station 1102 centered beneath the head 704, or from having one station 1102 centered beneath the head 704 to having another station centered beneath the head 704. With the first x-y translation stage 104 located at a station 1102, the second x-y translation stage 106 is configured for travel 1106 across the respective quarter 1101 (e.g., continuously back and forth across the quarter 1101) to scan the quarter (e.g., such that the entire quarter 1101 passes beneath the head 704). The second x-y translation stage 106 is thus configured to provide travel to scan respective quarters 1101 of the semiconductor wafer 1100 with the linear actuator situated at respective stations 1102, in accordance with some embodiments. The arrangement of stations 1102 shown in FIG. 11 is merely one possible arrangement; other arrangements and numbers of stations are possible. The use of a linear actuator simplifies the design of the first x-y translation stage 104 and reduces its weight and cost.

Figure 12:
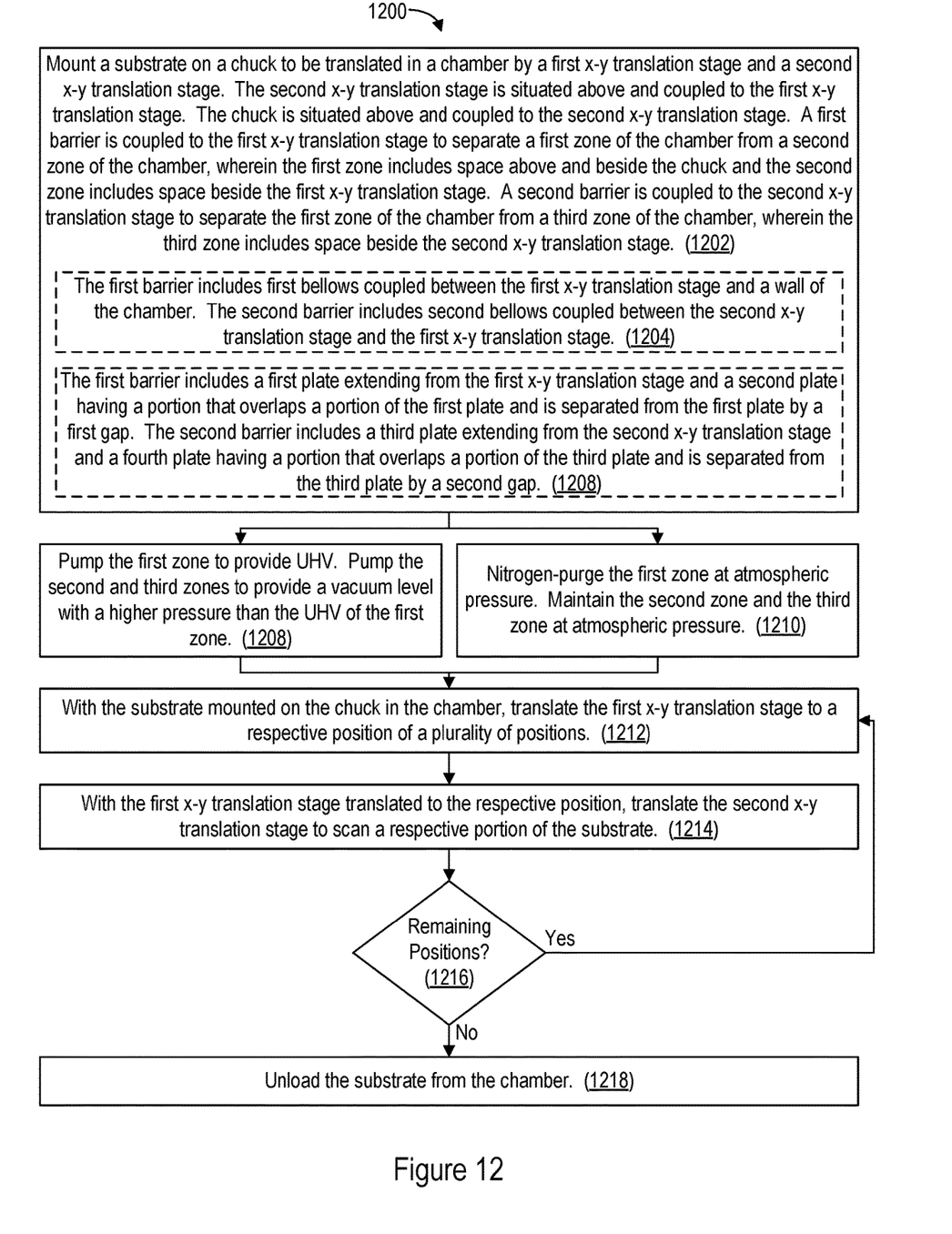
FIG. 12 is a flowchart showing a substrate-positioning method in accordance with some embodiments.

FIG. 12 is a flowchart showing a substrate-positioning method 1200 in accordance with some embodiments. In the method 1200, a substrate 110 is mounted (1202) on a chuck 108 to be translated in a chamber 102 (e.g., chamber 702, FIGS. 7-8; chamber 902, FIGS. 9-10) by a first x-y translation stage 104 and a second x-y translation stage 106. The second x-y translation stage 106 is situated above and coupled to the first x-y translation stage 104. The chuck 108 is situated above and coupled to the second x-y translation stage 106. A first barrier is coupled to the first x-y translation stage 104 to separate a first zone 116 of the chamber 102 from a second zone 118 of the chamber 102. The first zone 116 includes space above and beside the chuck 108 and the second zone 118 includes space beside the first x-y translation stage 104. A second barrier is coupled to the second x-y translation stage 106 to separate the first zone 116 of the chamber 102 from a third zone 120 of the chamber 102. The third zone 120 includes space beside the second x-y translation stage 106.

In some embodiments, the first barrier includes (1204) first bellows (e.g., bellows 112 or 400) coupled between the first x-y translation stage 104 and a wall of the chamber 102. The second barrier includes (1204) second bellows (e.g., bellows 114, 302, or 406) coupled between the second x-y translation stage 106 and the first x-y translation stage 104.

In some embodiments, the first barrier includes (1208) a first plate 502 extending from the first x-y translation stage 104 and a second plate 504 having a portion that overlaps a portion of the first plate 502 and is separated from the first plate 502 by a first gap 505. The second barrier includes (1208) a third plate 508 extending from the second x-y translation stage 106 and a fourth plate 510 having a portion that overlaps a portion of the third plate 508 and is separated from the third plate 508 by a second gap 512.

In some embodiments, the first zone 116 is pumped (1208) to provide UHV (e.g., by vacuum pump(s) 706, FIGS. 7-8). The second and third zones 118 and 120 are pumped (1208) to provide a vacuum level with a higher pressure than the UHV of the first zone 116 (e.g., by vacuum pump(s) 708, FIGS. 7-8).

In some embodiments, the first zone 116 is nitrogen-purged (1210) at atmospheric pressure (e.g., using purge lines 904 and 906, FIGS. 9-10). The second zone 118 and the third zone 120 are maintained (1210) at atmospheric pressure.

With the substrate 110 mounted on the chuck 108 in the chamber 102, the first x-y translation stage 104 is translated (1212) (e.g., with travel 1104, FIG. 11) to a respective position (e.g., a first position, a second position, etc.) (e.g., a respective station 1102, FIG. 11) of a plurality of positions. With the first x-y translation stage 104 translated to the respective position, the second x-y translation stage 106 is translated (1214) (e.g., with travel 1106, FIG. 11) to scan a respective portion of the substrate 110. Steps 1212 and 1214 are repeated for another position (e.g., another station 1102, FIG. 11) of the plurality of positions if there are remaining positions of the plurality of positions to which the first x-y translation stage 104 has not yet been translated (1216—Yes). Accordingly, the first x-y translation stage 104 is translated to respective positions of a plurality of positions. With the first x-y translation stage 104 translated to each position of the plurality of positions, the second x-y translation stage 106 is translated to scan a respective portion of the substrate 110. Once the first x-y translation stage 104 has been translated to every position of the plurality of positions (1216-No), and the substrate 110 has been scanned accordingly, the substrate 110 is unloaded (1218) from the chamber 102.

While the method 1200 includes a number of operations that are shown in a specific order, the method 1200 can include more or fewer operations. Operations may overlap and two or more operations may be combined into a single operation. For example, step 1208 or 1210 may be performed throughout the method 1200.

Figure 13:
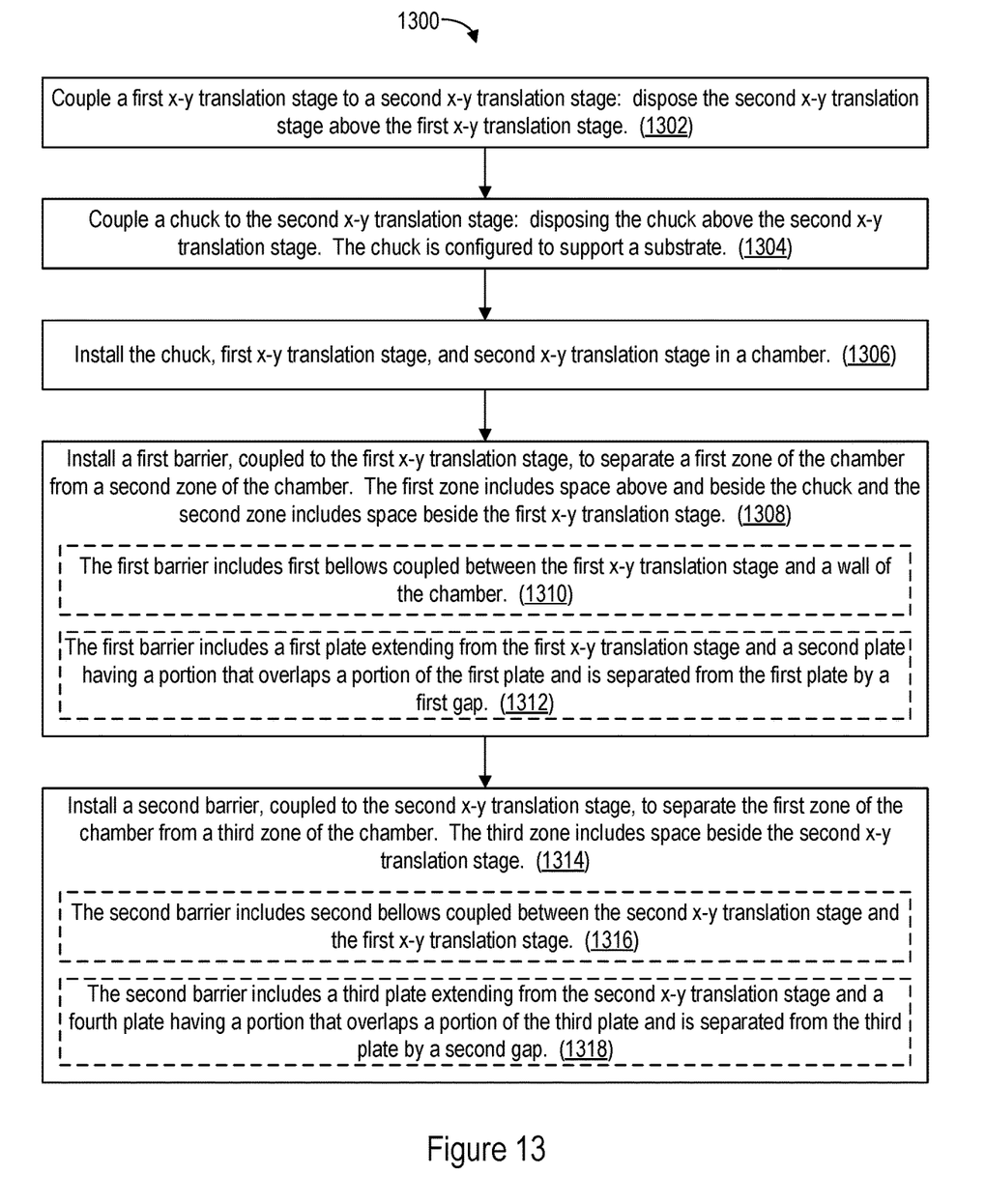
FIG. 13 is a flowchart showing a method of fabricating a substrate-positioning system in accordance with some embodiments

FIG. 13 is a flowchart showing a method 1300 of fabricating a substrate-positioning system in accordance with some embodiments. In the method 1300, a first x-y translation stage 104 is coupled (1302) to a second x-y translation stage 106, such that the second x-y translation stage 106 is disposed above the first x-y translation stage 104. A chuck 108 is coupled (1304) to the second x-y translation stage 106, such that the chuck 108 is disposed above the second x-y translation stage 106. The chuck 108 is configured to support a substrate 110. The chuck 108, first x-y translation stage 104, and second x-y translation stage 106 are installed (1306) in a chamber 102.

A first barrier, coupled to the first x-y translation stage 104, is installed (1308) to separate a first zone 116 of the chamber 102 from a second zone 118 of the chamber 102. The first zone 116 includes space above and beside the chuck 108. The second zone 118 includes space beside the first x-y translation stage 104. In some embodiments, the first barrier includes (1310) first bellows (e.g., bellows 112 or 400) coupled between the first x-y translation stage 104 and a wall of the chamber 102. In some embodiments, the first barrier includes (1312) a first plate 502 extending from the first x-y translation stage 104 and a second plate 504 having a portion that overlaps a portion of the first plate 502 and is separated from the first plate 502 by a first gap 505.

A second barrier, coupled to the second x-y translation stage 106, is installed (1314) to separate the first zone 116 of the chamber 102 from a third zone 120 of the chamber 102. The third zone 120 includes space beside the second x-y translation stage 106. In some embodiments, the second barrier includes (1316) second bellows (e.g., bellows 114, 302, or 406) coupled between the second x-y translation stage 106 and the first x-y translation stage 104. In some embodiments, the second barrier includes (1318) a third plate 508 extending from the second x-y translation stage 106 and a fourth plate 510 having a portion that overlaps a portion of the third plate 508 and is separated from the third plate 508 by a second gap 512.

While the method 1300 includes a number of operations that are shown in a specific order, the method 1300 can include more or fewer operations. An order of two or more operations may be changed or may overlap and two or more operations may be combined into a single operation. For example, the chuck 108, first x-y translation stage 104, and/or second x-y translation stage 106 may be coupled together as they are installed in the chamber 102.

Figure 14:
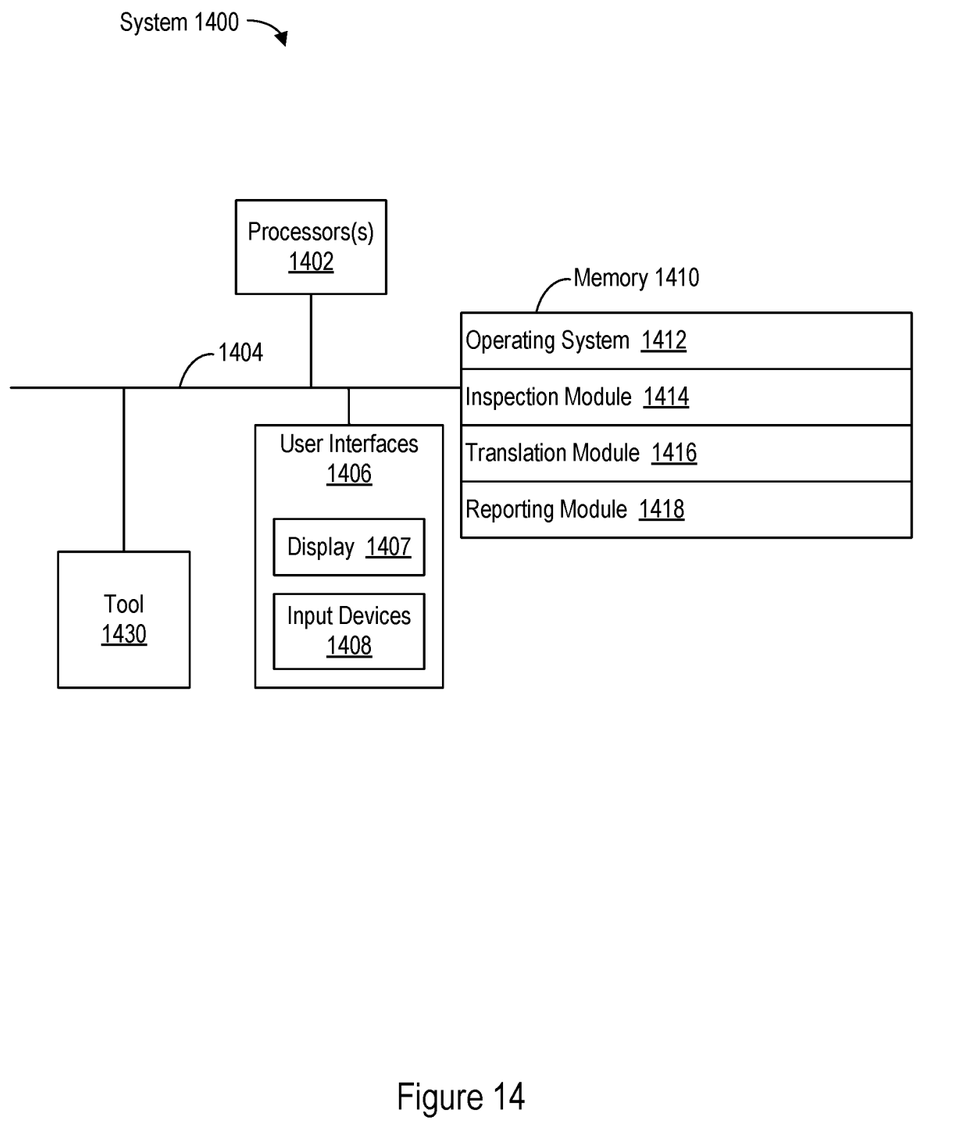
FIG. 14 is a block diagram of a system (e.g., an inspection system) that performs translation of a substrate in accordance with some embodiments.

FIG. 14 is a block diagram of a system 1400 that performs translation of a substrate 110 in accordance with some embodiments. In some embodiments, the system 1400 is an inspection system for inspecting substrates 110. For example, the system 1400 may be a semiconductor-wafer inspection system or a reticle inspection system. The system 1400 includes a tool 1430 (e.g., a substrate inspection tool) that includes a multi-stage substrate-positioning system in a chamber 102 (e.g., chamber 702, FIGS. 7-8; chamber 902, FIGS. 9-10). Examples of the tool 1430 include, without limitation, an electron microscope (e.g., a SEM) with a head 704 (FIGS. 7-8) or an optical inspection tool. The multi-stage substrate-positioning system includes a first x-y translation stage 104, a second x-y translation stage 106, and a chuck 108, and may include a z translation stage 122.

The system 1400 also includes a computer system with one or more processors 1402 (e.g., CPUs), user interfaces 1406, memory 1410, and communication bus(es) 1404 interconnecting these components and the tool 1430. Alternatively, the computer system may be communicatively coupled with the tool 1430 through one or more networks 1440. The computer system may further include one or more network interfaces (wired and/or wireless, not shown) for communicating with the tool 1430 and/or remote computer systems. The user interfaces 1410 may include a display 1407 and one or more input devices 1408 (e.g., a keyboard, mouse, touch-sensitive surface of the display 1407, etc.). The display 1407 may display results generated by the system 1400 (e.g., substrate-inspection results).

Memory 1410 includes volatile and/or non-volatile memory. Memory 1410 (e.g., the non-volatile memory within memory 1410) includes a non-transitory computer-readable storage medium. Memory 1410 optionally includes one or more storage devices remotely located from the processors 1402 and/or a non-transitory computer-readable storage medium that is removably inserted into the system 1400. In some embodiments, memory 1410 (e.g., the non-transitory computer-readable storage medium of memory 1410) stores the following modules and data, or a subset or superset thereof: an operating system 1412 that includes procedures for handling various basic system services and for performing hardware-dependent tasks, an inspection module 1414 for inspecting substrates 110, a translation module 1416 for translating substrates 110 (e.g., during inspection), and a reporting module 1418 for reporting results (e.g., inspection results). The memory 1410 (e.g., the non-transitory computer-readable storage medium of the memory 1410) may include instructions for performing all or a portion of the method 1200 (FIG. 12). Each of the modules stored in the memory 1410 corresponds to a set of instructions for performing one or more functions described herein. Separate modules need not be implemented as separate software programs. The modules and various subsets of the modules may be combined or otherwise re-arranged. For example, the inspection module 1414 and translation module 1416 may be combined. In some embodiments, the memory 1410 stores a subset or superset of the modules and/or data structures identified above.

FIG. 14 is intended more as a functional description of various features that may be present in the system 1400 than as a structural schematic. For example, the functionality of the computer system in the system 1400 may be split between multiple devices. A portion of the modules stored in the memory 1410 may alternatively be stored in one or more other computer systems communicatively coupled with the computer system of the system 1400 through one or more networks.

In some prophetic examples, use of a substrate-positioning system as described herein (e.g., as fabricated in accordance with the method 1400 and/or operated in accordance with the method 1300) prophetically provides a move-acquire-measure (MAM) time of 30-40 ms for a travel distance of 10-20 mm with nanometer-level settling stability. In some prophetic examples, the second x-y translation stage 106 provides 1-5 mm of travel in 20 ms.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A system comprising, in a chamber:
    a first x-y translation stage movable in x- and y-directions;
    a second x-y translation stage situated above and coupled to the first x-y translation stage, the second x-y translation stage being movable in the x- and y-directions while the first x-y translation stage is stationary;
    a chuck, situated above and coupled to the second x-y translation stage, to support a substrate and to be translated by the first and second x-y stages in the x- and y-directions, wherein the x- and y-directions are substantially parallel to a surface of the chuck on which the substrate is to be mounted;
    a first barrier, coupled to the first x-y translation stage, to separate a first zone of the chamber from a second zone of the chamber, wherein the first zone includes space above and beside the chuck and the second zone includes space beside the first x-y translation stage; and
    a second barrier, coupled to the second x-y translation stage, to separate the first zone of the chamber from a third zone of the chamber, wherein the third zone includes space beside the second x-y translation stage.

2. The system of claim 1, wherein:
the first x-y translation stage is configured to provide a first amount of travel that is insufficient to scan the entire substrate;
the second x-y translation stage is configured to provide a second amount of travel that is insufficient to scan the entire substrate; and
the first and second amounts of travel together are sufficient to scan the entire substrate.

3. The system of claim 2, wherein each of the first amount of travel and the second amount of travel is half of an amount of travel for scanning the entire substrate.

4. The system of claim 1, wherein:
the first barrier comprises first bellows coupled between the first x-y translation stage and a wall of the chamber; and
the second barrier comprises second bellows coupled between the second x-y translation stage and the first x-y translation stage.

5. The system of claim 1, wherein:
the first barrier comprises a first plate extending from the first x-y translation stage and a second plate having a portion that overlaps the first plate and is separated from the first plate by a first gap; and
the second barrier comprises a third plate extending from the second x-y translation stage and a fourth plate having a portion that overlaps the third plate and is separated from the third plate by a second gap.

6. The system of claim 5, wherein:
the second plate is connected to a wall of the chamber; and
the fourth plate is connected to the first x-y translation stage.

7. The system of claim 1, wherein the chamber is a vacuum chamber, the system further comprising:
one or more first pumps to pump the first zone to an ultra-high vacuum; and
one or more second pumps to pump the second zone and the third zone to a vacuum level with a higher pressure than the ultra-high vacuum of the first zone.

8. The system of claim 7, wherein the ultra-high vacuum of the first zone is on the order of $10^{-12}$ torr.

9. The system of claim 7, wherein the chamber further comprises a scanning electron microscope (SEM) head that extends into the first zone.

10. The system of claim 7, further comprising flexible tubing in the second zone to provide liquid coolant to the first x-y translation stage.

11. The system of claim 1, wherein:
the first zone is configured for nitrogen purge at atmospheric pressure during operation; and
the second zone and third zone are configured to be at atmospheric pressure during operation.

12. The system of claim 1, wherein the first x-y translation stage comprises a linear actuator having a plurality of defined stations to travel between.

13. The system of claim 12, wherein:
the substrate is a semiconductor wafer;
the plurality of defined stations comprises centers of each quarter of the semiconductor wafer; and
the second x-y translation stage is configured to provide travel to scan respective quarters of the semiconductor wafer with the linear actuator situated at respective stations.

14. The system of claim 1, wherein the second zone and the third zone are connected.

15. The system of claim 1, wherein the first x-y translation stage is heavier than the second x-y translation stage.

16. The system of claim 15, wherein the second x-y translation stage weighs 2-15 kg.

17. The system of claim 1, wherein the substrate is a semiconductor wafer or reticle.

18. A method, comprising:
mounting a substrate on a chuck to be translated in a chamber by a first x-y translation stage and a second x-y translation stage, wherein:
the second x-y translation stage is situated above and coupled to the first x-y translation stage;
the chuck is situated above and coupled to the second x-y translation stage;
x- and y-directions are substantially parallel to a surface of the chuck on which the substrate is mounted;
a first barrier is coupled to the first x-y translation stage to separate a first zone of the chamber from a second zone of the chamber, wherein the first zone includes space above and beside the chuck and the second zone includes space beside the first x-y translation stage; and
a second barrier is coupled to the second x-y translation stage to separate the first zone of the chamber from a third zone of the chamber, wherein the third zone includes space beside the second x-y translation stage;
with the substrate mounted on the chuck in the chamber, translating the first x-y translation stage in the x- and y-directions to a first position; and
with the first x-y translation stage translated to the first position, translating the second x-y translation stage in the x- and y-directions to scan a first portion of the substrate.

19. The method of claim 18, comprising:
with the substrate mounted on the chuck in the chamber, successively translating the first x-y translation stage to respective positions of a plurality of positions; and
with the first x-y translation stage translated to each position of the plurality of positions, translating the second x-y translation stage to scan a respective portion of the substrate.

20. The method of claim 18, further comprising, with the substrate mounted on the chuck in the chamber:
pumping the first zone to provide an ultra-high vacuum; and
pumping the second zone and the third zone to provide a vacuum level with a higher pressure than the ultra-high vacuum of the first zone.

21. The method of claim 18, further comprising, with the substrate mounted on the chuck in the chamber:
nitrogen-purging the first zone at atmospheric pressure; and
while nitrogen-purging the first zone, maintaining the second zone and the third zone at atmospheric pressure.

22. The method of claim 18, wherein:
the first barrier comprises first bellows coupled between the first x-y translation stage and a wall of the chamber; and
the second barrier comprises second bellows coupled between the second x-y translation stage and the first x-y translation stage.

23. The method of claim 18, wherein:
the first barrier comprises a first plate extending from the first x-y translation stage and a second plate having a portion that overlaps a portion of the first plate and is separated from the first plate by a first gap; and the second barrier comprises a third plate extending from the second x-y translation stage and a fourth plate having a portion that overlaps a portion of the third plate and is separated from the third plate by a second gap.

24. The method of claim 18, wherein translating the second x-y translation stage to scan a first portion of the substrate comprises moving the second x-y translation stage 1-5 mm in 20 ms.

25. The method of claim 18, wherein translating the second x-y translation stage to scan a first portion of the substrate comprises achieving a move-acquire-measure time of 30-40 ms for a travel distance of 10-20 mm.

26. A method, comprising:
coupling a first x-y translation stage to a second x-y translation stage, comprising disposing the second x-y translation stage above the first x-y translation stage;
coupling a chuck to the second x-y translation stage, comprising disposing the chuck above the second x-y translation stage, wherein the chuck is configured to support a substrate;
installing the chuck, first x-y translation stage, and second x-y translation stage in a chamber, wherein:
x- and y-directions are substantially parallel to a surface of the chuck on which the substrate is to be mounted,
the first x-y translation stage is movable in the x- and y-directions, and
the second x-y translation stage is movable in the x- and y-directions while the first x-y translation stage is stationary;
installing a first barrier, coupled to the first x-y translation stage, to separate a first zone of the chamber from a second zone of the chamber, wherein the first zone includes space above and beside the chuck and the second zone includes space beside the first x-y translation stage; and
installing a second barrier, coupled to the second x-y translation stage, to separate the first zone of the chamber from a third zone of the chamber, wherein the third zone includes space beside the second x-y translation stage.

27. The method of claim 26, wherein:
the first barrier comprises first bellows coupled between the first x-y translation stage and a wall of the chamber; and
the second barrier comprises second bellows coupled between the second x-y translation stage and the first x-y translation stage.

28. The method of claim 26, wherein:
the first barrier comprises a first plate extending from the first x-y translation stage and a second plate having a portion that overlaps a portion of the first plate and is separated from the first plate by a first gap; and
the second barrier comprises a third plate extending from the second x-y translation stage and a fourth plate having a portion that overlaps a portion of the third plate and is separated from the third plate by a second gap.

* * * * *